(12) United States Patent
Zundel et al.

(10) Patent No.: US 11,804,432 B2
(45) Date of Patent: Oct. 31, 2023

(54) SEMICONDUCTOR DEVICE WITH POLYMER-BASED INSULATING MATERIAL AND METHOD OF PRODUCING THEREOF

(71) Applicant: Infineon Technologies AG, Neubiberg (DE)

(72) Inventors: Markus Zundel, Egmating (DE); Sergey Ananiev, Ottobrunn (DE); Andreas Behrendt, Villach (AT); Holger Doepke, Sinzing (DE); Uwe Schmalzbauer, Siegertsbrunn (DE); Michael Sorger, Villach (AT); Dominic Thurmer, Moritzburg (DE)

(73) Assignee: Infineon Technologies AG, Neubiberg (DE)

( * ) Notice: Subject to any disclaimer, the term of this patent is extended or adjusted under 35 U.S.C. 154(b) by 83 days.

(21) Appl. No.: 17/173,863

(22) Filed: Feb. 11, 2021

(65) Prior Publication Data

US 2022/0254713 A1    Aug. 11, 2022

(51) Int. Cl.
*H01L 23/528* (2006.01)
*H01L 21/768* (2006.01)
*H01L 23/532* (2006.01)

(52) U.S. Cl.
CPC ...... *H01L 23/528* (2013.01); *H01L 21/76825* (2013.01); *H01L 21/76837* (2013.01);
(Continued)

(58) Field of Classification Search
CPC ............ H01L 23/528; H01L 21/76825; H01L 21/76837; H01L 23/5329; H01L 24/73; H01L 24/05; H01L 24/06; H01L 24/37; H01L 24/40; H01L 24/48; H01L 24/84; H01L 29/4238; H01L 2224/04034; H01L 2224/04042; H01L 2224/05124; H01L 2224/05147; H01L 2224/05166; H01L 2224/05184; H01L 2224/05624; H01L 2224/05647; H01L 2224/0603; H01L 2224/37147; H01L 2224/40225;
(Continued)

(56) References Cited

U.S. PATENT DOCUMENTS

| 4,618,878 | A | * | 10/1986 | Aoyama | ............. H01L 23/5329 |
|---|---|---|---|---|---|
| | | | | | 257/640 |
| 4,847,162 | A | * | 7/1989 | Haluska | ............. H01L 21/02255 |
| | | | | | 427/404 |
| 2018/0204915 | A1 | * | 7/2018 | Heinle | ............. H01L 21/02271 |

* cited by examiner

*Primary Examiner* — Patricia D Valenzuela
(74) *Attorney, Agent, or Firm* — Murphy, Bilak & Homiller, PLLC

(57) ABSTRACT

A semiconductor device includes a semiconductor substrate having a first main surface and a metal structure above the first main surface. The metal structure has a periphery region that includes a transition section along which the metal structure transitions from a first thickness to a second thickness less than the first thickness. A polymer-based insulating material contacts and covers at least the periphery region of the metal structure. A thickness of the polymer-based insulating material begins to increase on a first main surface of the metal structure that faces away from the semiconductor substrate and continues to increase in a direction towards the transition section. An average slope of a surface of the polymer-based insulating material which faces away from the semiconductor substrate, as measured with respect to the first main surface of the metal structure, is less than 60 degrees along the periphery region of the metal structure.

20 Claims, 7 Drawing Sheets

(52) U.S. Cl.
CPC ...... *H01L 23/5329* (2013.01); *H01L 2924/00* (2013.01); *H01L 2924/0002* (2013.01)

(58) Field of Classification Search
CPC . H01L 2224/40499; H01L 2224/45014; H01L 2224/45099; H01L 2224/48227; H01L 2224/73221; H01L 2224/73271; H01L 2224/84399; H01L 2224/84801; H01L 2224/85399; H01L 2924/00014; H01L 2924/13055; H01L 2924/13091; H01L 23/3171; H01L 29/41725; H01L 21/56; H01L 23/293; H01L 29/401; H01L 2924/00; H01L 2924/0002
See application file for complete search history.

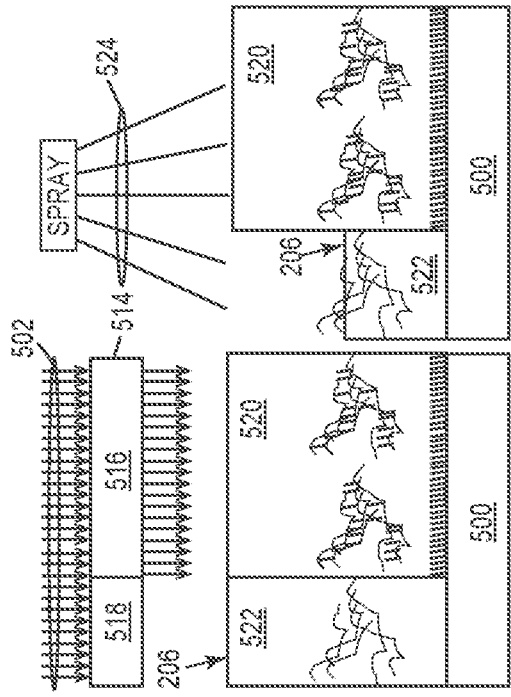
*Figure 5A*
*Figure 5B*
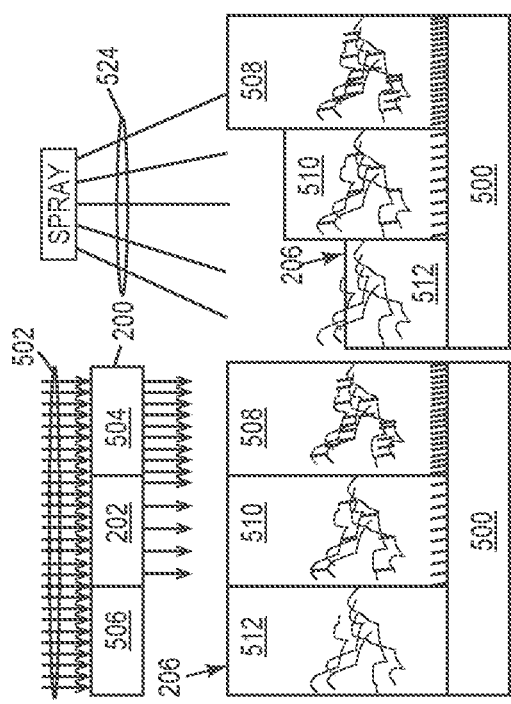
*Figure 5C*
*Figure 5D*
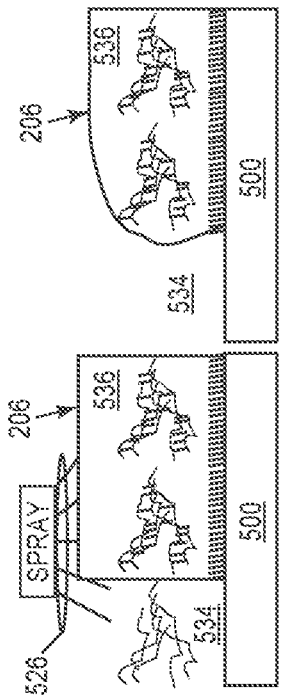
*Figure 6A*
*Figure 6B*
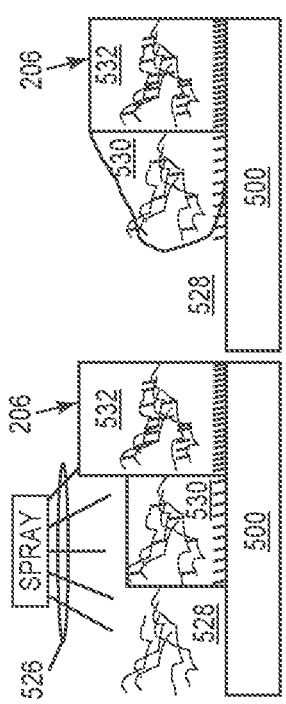
*Figure 6C*
*Figure 6D*

US 11,804,432 B2

SEMICONDUCTOR DEVICE WITH POLYMER-BASED INSULATING MATERIAL AND METHOD OF PRODUCING THEREOF

BACKGROUND

Power MOSFETs (metal-oxide semiconductor field-effect transistors) are widely used in many types of applications, some of which require fast switching speeds. To accommodate fast switching speeds, power MOSFETs may have gate finger structures that more uniformly distribute the gate signal to individual transistor cells. However, the gate finger structures run over the active cell field and have considerable topology levels. The topology levels of the gate finger structures create additional stress in all layers involved, which can be discharged into cracks that present a reliability risk.

Thus, there is a need for an improved power MOSFET design with reduced topology levels around gate finger and other type of metal structures.

SUMMARY

According to an embodiment of a semiconductor device, the semiconductor device comprises: a semiconductor substrate having a first main surface; a metal structure above the first main surface of the semiconductor substrate, the metal structure having a periphery region that includes a transition section along which the metal structure transitions from a first thickness to a second thickness less than the first thickness; and a polymer-based insulating material in contact with and covering at least the periphery region of the metal structure, wherein a thickness of the polymer-based insulating material begins to increase on a first main surface of the metal structure that faces away from the semiconductor substrate and continues to increase in a direction towards the transition section of the metal structure, wherein an average slope of a surface of the polymer-based insulating material which faces away from the semiconductor substrate, as measured with respect to the first main surface of the metal structure, is less than 60 degrees along the periphery region of the metal structure.

According to another embodiment of a semiconductor device, the semiconductor device comprises: a semiconductor substrate having a first main surface; a first electrically conductive structure above the first main surface of the semiconductor substrate, the first electrically conductive structure having a region; a polymer-based insulating material in contact with and covering at least the region of the first electrically conductive structure, wherein a thickness of the polymer-based insulating material begins to increase on a first main surface of the first electrically conductive structure that faces away from the semiconductor substrate, wherein an average slope of a surface of the polymer-based insulating material which faces away from the semiconductor substrate, as measured with respect to the first main surface of the first electrically conductive structure, is less than 60 degrees along the region of the first electrically conductive structure; and a second electrically conductive structure above the polymer-based insulating material.

According to an embodiment of a method of producing a semiconductor device, the method comprises: forming a metal structure above a first main surface of a semiconductor substrate, the metal structure having a periphery region that includes a transition section along which the metal structure transitions from a first thickness to a second thickness less than the first thickness; forming a polymer-based insulating material on at least the periphery region of the metal structure; varying a degree of polymer cross-linking within the polymer-based insulating material along the periphery region of the metal structure, such that the degree of the polymer cross-linking increases with increasing thickness of the polymer-based insulating material; and after varying the degree of the polymer cross-linking, curing the polymer-based insulating material.

According to another embodiment of a semiconductor device, the semiconductor device comprises: a semiconductor substrate having a first main surface; a metal structure above the first main surface of the semiconductor substrate, the metal structure having a periphery region that includes a transition section along which the metal structure transitions from a first thickness to a second thickness less than the first thickness; and a polymer-based insulating material in contact with and covering at least the periphery region of the metal structure, wherein a thickness of the polymer-based insulating material begins to increase on a first main surface of the metal structure that faces away from the semiconductor substrate and continues to increase in a direction towards the transition section of the metal structure, wherein the polymer-based insulating material has undulations over the transition section of the metal structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 5E illustrate partial cross-sectional views during different stages of an embodiment of a method of producing the semiconductor device by applying grayscale lithography to the polymer-based insulating material using the photolithographic mask.

FIGS. 6A through 6E illustrate the same partial cross-sectional views as FIGS. 5A through 5E, respectively, but without the use of grayscale lithographic processing.

DETAILED DESCRIPTION

Described herein are embodiments of semiconductor devices with reduced topology levels around metal structures. According to embodiments described herein, an electrically conductive structure formed above a semiconductor substrate has a periphery region that includes a transition section along which the electrically conductive structure transitions from a first thickness to a second thickness less than the first thickness. A polymer-based insulating material which contacts and covers at least the periphery region of the electrically conductive structure has a thickness that begins to increase on a surface of the electrically conductive structure that faces away from the semiconductor substrate and continues to increase in a direction towards the transition section of the electrically conductive structure. The average slope of the surface of the polymer-based insulating material which faces away from the semiconductor substrate is less than 60 degrees along the periphery region of the electrically conductive structure. Such a sloped surface for the polymer-based insulating material reduces the topology levels in this region of the device. Reducing or flattening the thickness transition of the polymer-based insulating material above the periphery region of the electrically conductive structure eases the topology levels of any overlying layer such as a power metallization layer or layer stack, reducing the likelihood of cracks forming in this region of the device.

Described next, with reference to the figures, are exemplary embodiments of techniques for reduced topology levels around metal structures of a semiconductor device.

Figure 1A:
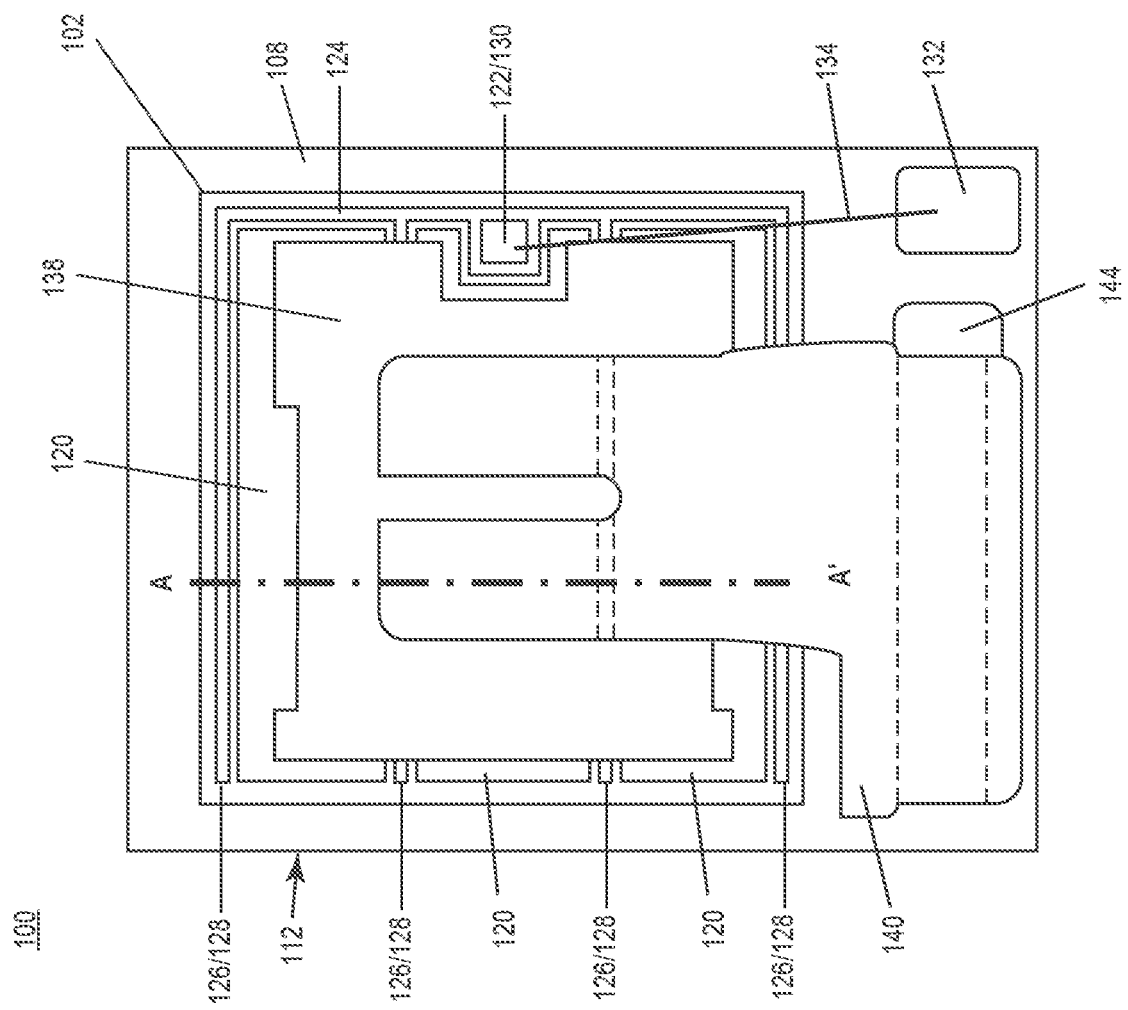
FIG. 1A illustrates a top plan view of an embodiment of a semiconductor device.
Figure 1B:
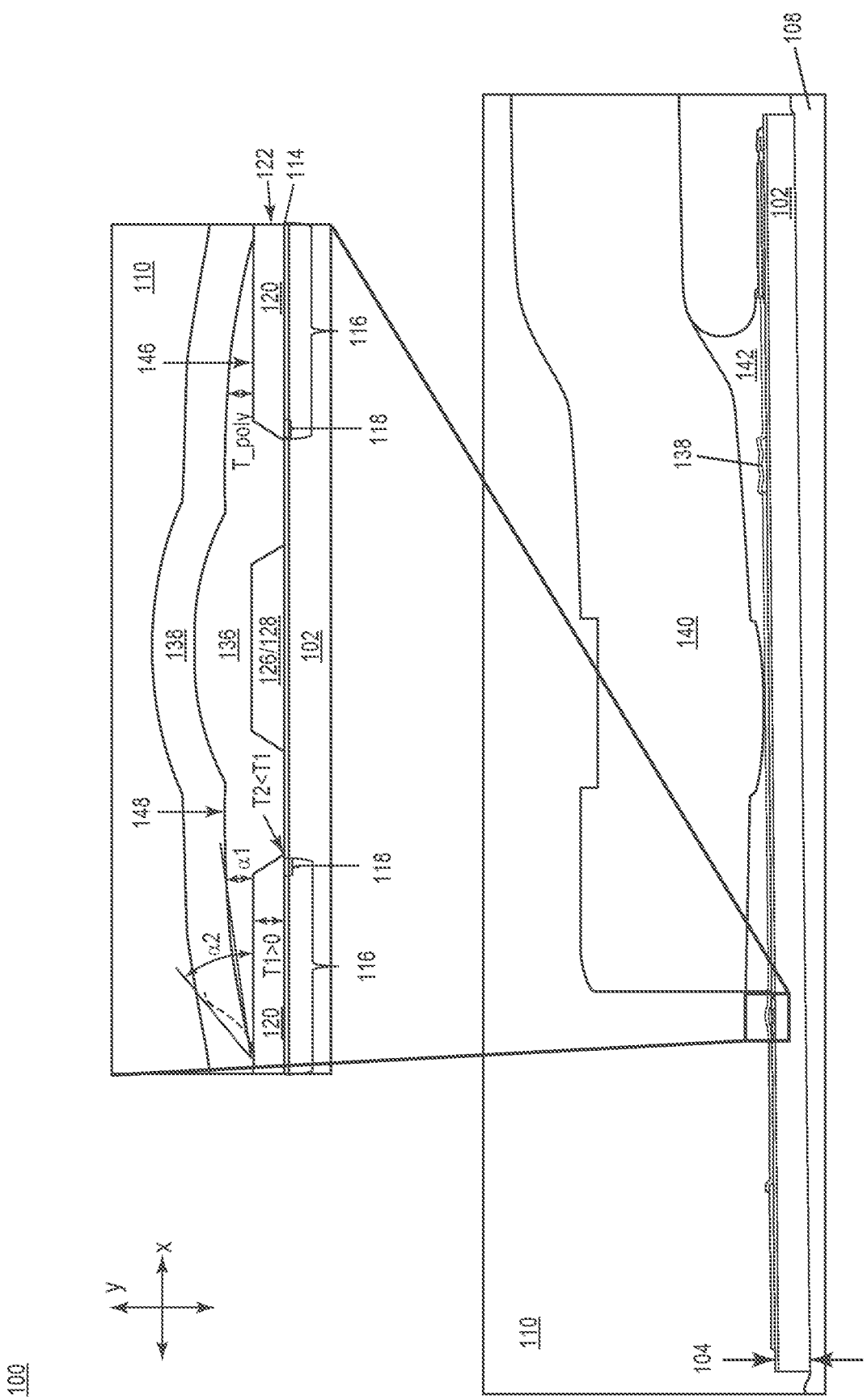
FIG. 1B illustrates a cross-sectional view of the semiconductor device along the line labelled A-A' in FIG. 1A.

FIG. 1A illustrates a top plan view of an embodiment of a semiconductor device 100. FIG. 1B illustrates a cross-sectional view of the semiconductor device 100 along the line labelled A-A' in FIG. 1A.

The semiconductor device 100 includes a semiconductor substrate 102 having a first main surface 104 and a second main surface 106 opposite the first main surface 104. The semiconductor substrate 102 may include one or more of a variety of semiconductor materials that are used to form semiconductor devices such as power MOSFETs, IGBTs, SiC transistors, etc. For example, the semiconductor substrate 102 may include silicon (Si), silicon carbide (SiC), germanium (Ge), silicon germanium (SiGe), gallium nitride (GaN), gallium arsenide (GaAs), and the like. The semiconductor substrate 102 may be a bulk semiconductor material or may include one or more epitaxial layers grown on a bulk semiconductor material. The semiconductor substrate 102 may include device cells such as transistor and/or diode cells in an active cell field. The active cell field is not shown in FIGS. 1A and 1B to emphasize other features of the semiconductor device 100, but may include planar and/or trench device cells as is well understood in the art.

The semiconductor substrate 102 may be attached to a support substrate 108 at the second main surface 106 of the semiconductor substrate 102. The support substrate 108 may be a lead frame, a circuit board such as a PCB (printed circuit board), a DBC (direct bonded copper) substrate, an AMB (active metal brazed) substrate, an IMS (insulated metal substrate), etc. The semiconductor substrate 102 may be encapsulated in a molding compound 110.

The semiconductor device 100 further includes a first electrically conductive structure 112 formed above the first main surface 104 of the semiconductor substrate 102 and separated from the semiconductor substrate 102 by at least one insulating layer 114. The first electrically conductive structure 112 may be a metal structure of a metallization layer or layer stack and may comprise a metal or metal alloy such as Cu, Al, AlCu, etc. The first electrically conductive structure 112 has a periphery region 116 that includes a transition section 118 along which the first electrically conductive structure 112 transitions from a first thickness 'T1' to a second thickness 'T2' less than the first thickness T1. As shown in the enlarged view of FIG. 1B, the first electrically conductive structure 112 may transition to a second thickness T2 of zero in the transition section 118.

In one embodiment, the semiconductor device 100 is a power transistor and the first electrically conductive structure 112 includes first metal structures 120 which are at a source potential and laterally separated from a second metal structure which is at a second potential that is different from the source potential. For example, the second metal structure may be a gate metallization structure that is at a gate potential. The gate metallization structure may include a gate pad 122, a gate runner 124 extending from the gate pad 122 and running along one or more outer sides of the first electrically conductive structure 112, and gate fingers 126 running between the first metal structures 120 which are at source potential. In another example, the second metal structure may be a sensor line 128 extending from a sensor pad 130. In this example, the second metal structure is at a potential of a sense signal. The gate pad 122/sensor pad 130 of the semiconductor device 100 may be electrically connected to a lead 132 by an electrical conductor 134 such as a wire bond, wire ribbon, etc.

In each case, the semiconductor device 100 further includes a polymer-based insulating material 136 in contact with and covering at least the periphery region 116 of the first electrically conductive structure 112. In FIG. 1B, the polymer-based insulating material 136 also is in contact with and covers the gate fingers 126/sensor line 128 of the first electrically conductive structure 112. In one embodiment, the polymer-based insulating material 132 is formed by forming one or more polyimide layers on the periphery region 116 of the first electrically conductive structure 112. The molding compound 110 and the polymer-based insulating material 138 are not shown in FIG. 1A to provide an unobstructed view of the underlying structures.

The polymer-based insulating material 136 separates an overlying metallization layer or layer stack 138 from the underlying gate fingers 126/sensor line 128 to ensure that the first metal structures 120 of the first electrically conductive structure 112 are electrically isolated from the gate fingers 126/sensor line 128. The overlying metallization layer or layer stack 138 contacts the first electrically conductive structure 112 outside the periphery region 116 of the first electrically conductive structure 112 where the polymer-based insulating material 136 is not present. A metal clip 140 such as a Cu clip may be attached to the overlying metallization layer or layer stack 138 via solder or other suitable joining material 142 to electrically connect the first metal structures 120 of the first electrically conductive structure 112 to a corresponding lead or leads 144.

In one embodiment, the first electrically conductive structure 112 comprises AlCu, the overlying metallization layer or layer stack 138 comprises a Cu layer and a Cu diffusion barrier such as WTi on which the Cu layer is formed, and the polymer-based insulating material 136 separates the overlying metallization layer or layer stack 138 from the underlying AlCu gate fingers 126/sensor line 128. In another embodiment, the first electrically conductive structure 112 and the overlying metallization layer or layer stack 138 both comprise the same material such as Cu, Al, AlCu, etc.

In each case, the thickness 'T_poly' of the polymer-based insulating material 136 begins to increase on the main surface 146 of the first electrically conductive structure 112 that faces away from the semiconductor substrate 102 and continues to increase in a direction (x direction in FIG. 1B) towards the transition section 118 of the first electrically conductive structure 112. In FIG. 1B, this means that the thickness T_poly of the polymer-based insulating material 136 begins to increase along the periphery region 116 of the first electrically conductive structure 112 in a lateral direction heading toward the gate fingers 126/sensor line 128.

The average slope 'α1' of the surface 148 of the polymer-based insulating material 136 which faces away from the semiconductor substrate 102, as measured with respect to the first main surface 146 of the first electrically conductive structure 112, is less than 60 degrees, less than 45 degrees, less than 35 degrees, or even less than 20 degrees along the periphery region 116 of the first electrically conductive structure 112. Such reduced topology levels above the periphery region 116 of the first electrically conductive structure 112 flatten the profile of the overlying layer(s) including the overlying metallization layer or layer stack 138 and reduce or altogether avoid stress and crack risk in this region of the semiconductor device 100.

Conventional photolithographic processing techniques would have yielded a much steeper profile for the polymer-based insulating material 136 along the periphery region 116 of the first electrically conductive structure 112. As indicated by the dashed curve in the enlarged view of FIG. 1B, if formed by conventional photolithographic processing techniques, the average slope 'α2' of the surface 148 of the polymer-based insulating material 136 which faces away from the semiconductor substrate 102, as measured with respect to the first main surface 146 of the first electrically conductive structure 112, would have been greater than 60 degrees, e.g., 70 degrees or larger along the periphery region 116 of the first electrically conductive structure 112. This means that the overlying metallization layer or layer stack 138 would have the same steep profile in this region of the semiconductor device 100, which can lead to cracks and related reliability issues. For example, the first electrically conductive structure 112 may include a thin WTi diffusion barrier which is prone to microcracks if the average slope α2 of the thin WTi diffusion barrier is greater than 60.

Described next are embodiments of flattening the profile of the polymer-based insulating material 136 along the periphery region 116 of the first electrically conductive structure 112, so that the average slope α1 of the polymer-based insulating material 136 is less than 60 degrees, less than 45 degrees, less than 35 degrees, or even less than 20 degrees along the periphery region 116 of the first electrically conductive structure 112.

Figure 2:
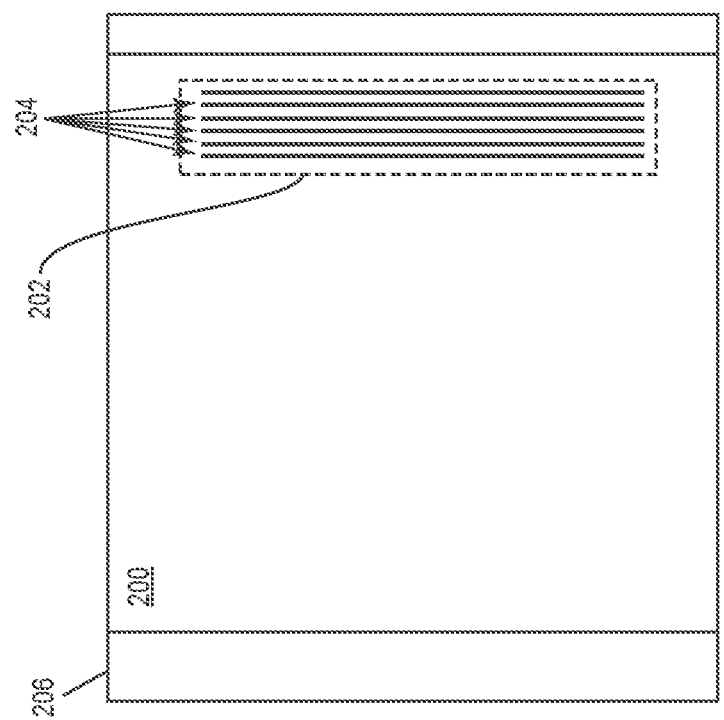
FIG. 2 illustrates a top plan view of an embodiment of a photolithographic mask used in forming a polymer-based insulating material of the semiconductor device.

FIG. 2 illustrates a top plan view of an embodiment of a photolithographic mask 200 used in forming the polymer-based insulating material 136 in a region where the topology/step profile of the polymer-based insulating material 136 is to be reduced or flattened. According to this embodiment, the photolithographic mask 200 has a grayscale zone 202 with stripes 204 for lithographically processing a polymer starting material 206. The stripes 204 may have equal or different dimensions with equal or different spacing between the stripes 204.

Lithographic processing of the polymer starting material 206 using the photolithographic mask 200 with the grayscale zone 202 yields the polymer-based insulating material 136. The grayscale zone 202 varies the degree of polymer cross-linking within the polymer-based insulating material 136 along the periphery region 116 of the first electrically conductive structure 112, such that the degree of the polymer cross-linking increases with increasing thickness of the polymer-based insulating material 136.

In general, any type of polymer starting material 206 that yields a polymer-based dielectric or passivation layer may be used. For example, the polymer starting material 206 may be polyimide, epoxy, PBO (polybenzoxazole), imide, etc. For positive tone materials such as PBO, the polymer starting material 206 remains where not exposed to light to form the polymer-based insulating material 136. For negative tone materials such as imide, the polymer starting material 206 remains where exposed to light to form the polymer-based insulating material 136. The pattern of the grayscale zone 202 may be inverted depending on whether a negative or positive tone polymer starting material 206 is used.

After grayscale lithographic processing with the photolithographic mask 200, the resulting polymer-based insulating material 136 may have undulations with a wavelike form which correspond to the grayscale zone 202 of the photolithographic mask 200. The undulations have a similar shape, periodicity, spacing, etc. as that of the stripes 204 included in the grayscale zone 202 of the photolithographic mask 200.

The grayscale lithography processing may be applied to a region with increasing thickness of the polymer-based insulating material 136. For example, the undulations may be formed in the polymer-based insulating material 136 along the periphery region 116 of the first electrically conductive structure 112. The undulations yield a less steep increase (α1<α2) in the average slope α1 of the polymer-based insulating material 136 in a region aligned with of the grayscale zone 202 of the photolithographic mask 200. The undulations are not produced outside the grayscale zone 202.

Figure 3:
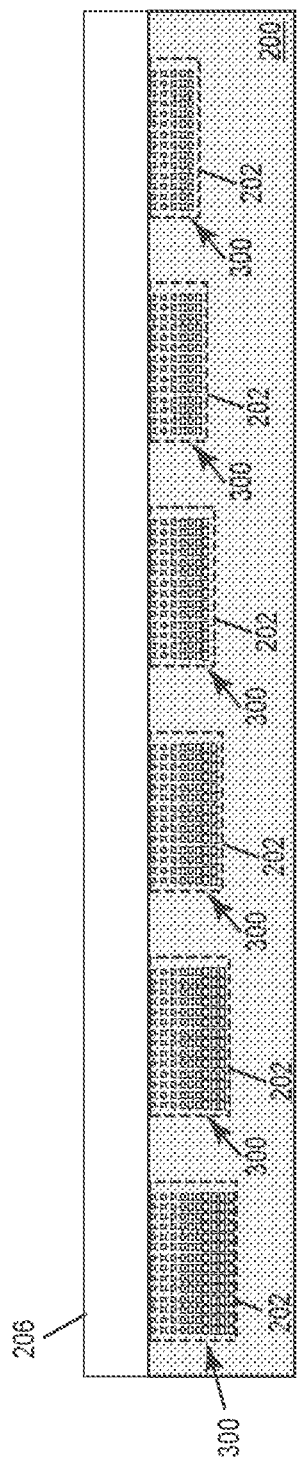
FIG. 3 illustrates a top plan view of another embodiment of the photolithographic mask used in forming the polymer-based insulating material of the semiconductor device.

FIG. 3 illustrates additional embodiments of the grayscale zone 202 of the photolithographic mask 200 used in forming the polymer-based insulating material 136 in a region where the topology/step profile of the polymer-based insulating material 136 is to be reduced or flattened. Instead of stripes 204 as shown in FIG. 2, the grayscale zone 202 may instead have other geometric shapes 300 such as pixel-like structures which may vary in size, shape and/or spacing with increasing thickness of the polymer-based insulating material 136 to yield the desired undulation profile. The resulting undulations formed in the polymer-based insulating material 136 using the photolithographic mask 200 have a similar shape, periodicity, spacing, etc. as that of the geometric shapes 300 included in the grayscale zone 202 of the photolithographic mask 200.

Figure 4:
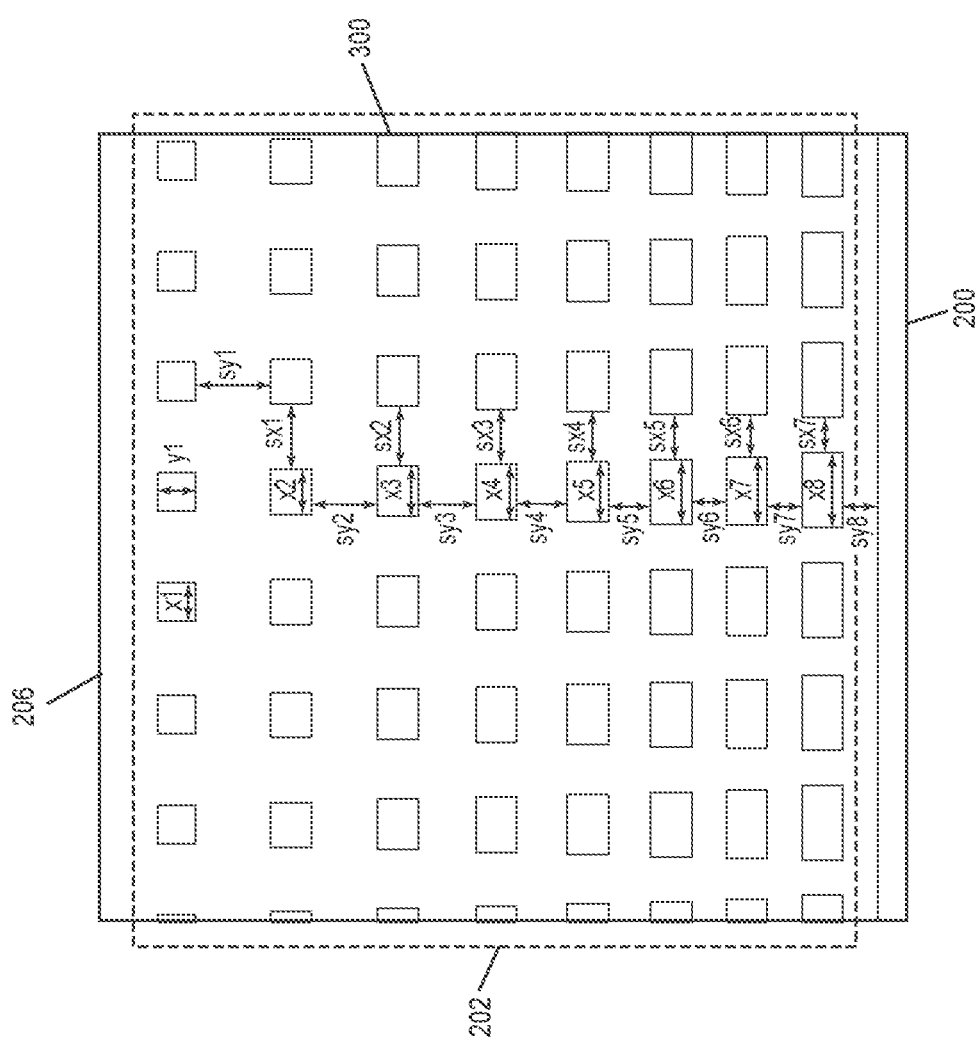
FIG. 4 illustrates part of a grayscale zone of the photolithographic mask.

FIG. 4 shows part of a grayscale zone 202 of the photolithographic mask 200. According to this embodiment, the dimensions (x, y parameters in FIG. 4) of the geometric shapes 204/300 and the spacing (sx, sy parameters in FIG. 4) between rows and columns of the geometric shapes 204/300 may vary with increasing thickness of the polymer-based insulating material 136 to yield the desired undulation profile. For example, the area of the geometric shapes 204/300 may be in a range of 1 to 5 um. The spacing may vary from 50% to 95% of the size of the largest geometric shape 204/300. In another example, the area of the geometric shapes 204/300 may be ½ thickness or less (to almost zero) of the polymer starting material 206. The size and spacing of the geometric shapes 204/300 may depend on the type of illuminated light to which the polymer starting material 206 is exposed as part of the grayscale lithographic processing. The geometric shapes 204/300 may be stripes, rectangles, pixels, trapezoids, triangles, etc. The geometric shapes 204/300 may have a meandering layout if the underlying topology meanders, e.g., corners, rounded/radius, etc.

In one embodiment, the photolithographic mask 200 shown in FIGS. 2, 4 and 5 is formed by sputtering a chromium layer on a glass substrate and etching the shapes 204/300 into the chromium layer. In another embodiment, the photolithographic mask 200 shown in FIGS. 2 through 4 is formed by sputtering a plurality of chromium layers of different thicknesses on a glass substrate.

FIGS. 5A through 5E illustrate partial cross-sectional views during different stages of an embodiment of a method of producing the semiconductor device 100, by applying grayscale lithography to a region of the polymer-based insulating material 136 with increasing thickness using the photolithographic mask 200 having the grayscale zone 202. FIGS. 6A through 6E show the same partial cross-sectional views as FIGS. 5A through 5E, respectively, but without the use of grayscale lithographic processing.

FIG. 5A shows the polymer starting material 206 applied to an underlying layer 500. The underlying layer 500 may correspond to the first electrically conductive structure 112 described herein, but is illustrated simplistically to emphasize the grayscale lithographic processing of the polymer starting material 206 using the photolithographic mask 200. The photolithographic mask 200 includes a grayscale zone 202 with stripes 204 or other geometric shapes 300, as previously described herein. The photolithographic mask 200 is illustrated for a negative tone polymer starting material 206 but the pattern of the grayscale zone 202 may be reversed for a positive tone polymer starting material 206. The photolithographic mask 200 is illuminated with light 502. A first region 504 of the photolithographic mask 200 outside the grayscale zone 202 allows the light 502 to pass unimpeded to the polymer starting material 206. A second region 506 of the photolithographic mask 200 outside the grayscale zone 202 prevents the light 502 from reaching the polymer starting material 206.

The shapes 204/300 in the grayscale zone 202 of the photolithographic mask 200 block some but not all of the light 502 from reaching the polymer starting material 206. In one embodiment, the size of the geometric shapes 204/300 is in a range of a sub-resolution of the polymer starting material 206. For example, in the case of polyimide as the polymer-based insulating material 136, polyimide has a resolution greater than 5 µm and the size of the geometric shapes 204/300 in the grayscale zone 202 of the photolithographic mask 200 may be less than 5 µm. By applying grayscale lithography to the polymer starting material 206 using the photolithographic mask 200 with the grayscale zone 202, the polymer starting material 206 has a first region 508 which is fully exposed, a second region 510 which is partly exposed, and a third region 512 which has no exposure to the light 502.

In the first region 508 of the polymer starting material 206, the polymer starting material 206 fully reacts with the light 502 and cross-links the polymer structure in between and to make the polymer structure stable to later dissolution by a developer. Less exposure and less cross-linking between polymers occurs in the second region 510 of the polymer starting material 206. No cross-linking occurs in the third region 512 of the polymer starting material 206, which allows for subsequent fully developed wash away of the polymer. In FIGS. 5A through 6E, the polymers are indicated by squiggly lines and the cross-links by vertical lines which extend between polymers or between the polymer starting material 206 and the underlying layer 500.

In contrast, FIG. 6A shows that the non-grayscale lithographic processing uses a photolithographic mask 514 that only has a first region 516 that allows the light 502 to pass unimpeded to the polymer starting material 206 and a second region 518 that prevents the light 502 from reaching the polymer starting material 206. The photolithographic mask 514 in FIG. 6A does not have a grayscale zone. Accordingly, the polymer starting material 206 in FIG. 6A only has a first region 520 which is fully exposed and a second region 522 which has no exposure to the light 502. The polymer starting material 206 in FIG. 6A does not have a region with partial exposure to the light 502.

FIG. 5B shows a first spray step during which a first developer solution 524 that acts as a solvent is applied to the polymer starting material 206 and washes away each part of the polymer starting material 206 which is not cross-linked. Accordingly, the third region 512 of the polymer starting material 206 has very fast development. Less development occurs in the second region 510 of the polymer starting material 206, and little or no development occurs in the first region 508 of the polymer starting material 206.

In contrast, FIG. 6B shows that the process which does not employ grayscale lithographic processing yields one region 522 of the polymer starting material 206 with very fast development and another region 520 with little or no development, with no intermediary region of development therebetween.

FIG. 5C shows a second spray step during which a second developer solution 526 is applied to the polymer starting material 206 to complete the washing away of all non-crosslinked polymer material.

FIG. 5D shows the structure after the second spray step with a first region 528 where the polymer starting material 206 is completely removed, a second region 530 where the polymer starting material 206 is partly removed and therefore has a reduced thickness in this region 530, and a third region 532 where the fully crosslinked polymer starting material 206 remains intact with a greater thickness than in the second region 530.

In contrast, FIGS. 6C and 6D show that the process which does not employ grayscale lithographic processing yields a first region 534 where the polymer starting material 206 is completely removed and a second region 536 where the fully crosslinked polymer starting material 206 remains intact, with no intermediary thickness region therebetween.

Figure 5E:
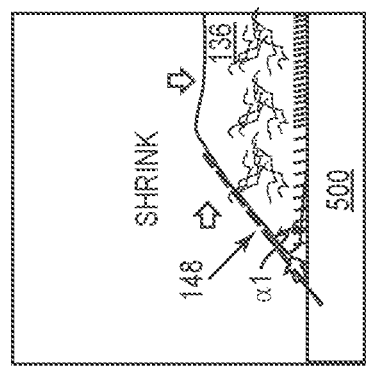

FIG. 5E shows a curing step during which further cross linking of the remaining polymer structure occur, driving out remaining solvent from the polymer structure and forming the polymer-based insulating material 136. The structure may be cured in an oven, by UV light, etc. depending on the type of polymer starting material 206 used. Shrinkage of the polymer structure occurs during the curing as indicated by the arrows in FIG. 5B, resulting in a certain slope profile. The structure may be subjected to a plasma process after curing to remove some of the surface topology/roughness. For example, the grey scale region of the polymer-based insulating material 136 with increasing thickness may be smooth or have surface topology/roughness, depending on subsequent processing. A different process may be applied to intentionally roughen the surface of the polymer-based insulating material 136, e.g., to enhance adhesion by the molding compound 110 shown in FIG. 1B.

The grayscale lithographic processing shown in FIGS. 5A through 5E yields an average slope α1 of the surface 148 of the polymer-based insulating material 136 which faces away from the underlying layer 500 that is less than 60 degrees, less than 45 degrees, less than 35 degrees, or even less than 20 degrees in a region of increasing thickness for the polymer-based insulating material 136.

Figure 6E:
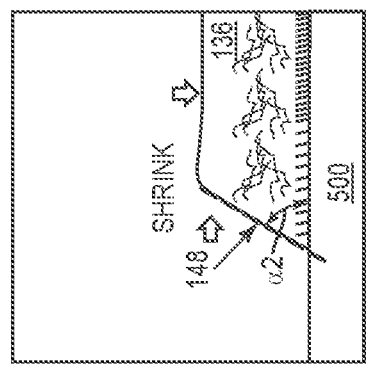

In contrast, FIG. 6E shows that the process which does not employ grayscale lithographic processing yields an average slope α2 greater than 60 degrees in a region of increasing thickness for the polymer-based insulating material 136. The steeper sloped profile in FIG. 6E arises because the photolithographic mask 514 used in FIGS. 6A through 6E does not yield an intermediary region for the polymer-based insulating material 136 having a more gradual thickness increase.

Instead, the thickness transition is much more abrupt in FIG. 6E which can lead to crack formation in a metallization layer or layer stack to be formed above the polymer-based insulating material 136.

The method shown in FIGS. 5A through 5E varies the degree of cross-linking from the edge transition of the polymer-based insulating material 136 inward. The cross-linking variation may be applied in any region where the polymer-based insulating material 136 crosses a topology step. For example, the cross-linking variation may be applied in a region that includes gate fingers and/or a sensor line that are isolated from source potential. Separately or in combination, the cross-linking variation may be applied to a gate pad edge termination and/or any pads in general. Separately or in combination, the cross-linking variation may be applied to dicing edge of semiconductor chips (dies) where the chips are singulated. The grayscale lithography embodiments described herein may provide energy saving and mitigation of energy use, by improving power MOSFET reliability. The improved reliability allows for a durable use of the power MOSFET, e.g., in a solar cell. A durable use means sustainability and therefore, energy use is mitigated by using the grayscale lithography embodiments described herein.

Although the present disclosure is not so limited, the following numbered examples demonstrate one or more aspects of the disclosure.

Example 1. A semiconductor device, comprising: a semiconductor substrate having a first main surface; a metal structure above the first main surface of the semiconductor substrate, the metal structure having a periphery region that includes a transition section along which the metal structure transitions from a first thickness to a second thickness less than the first thickness; and a polymer-based insulating material in contact with and covering at least the periphery region of the metal structure, wherein a thickness of the polymer-based insulating material begins to increase on a first main surface of the metal structure that faces away from the semiconductor substrate and continues to increase in a direction towards the transition section of the metal structure, wherein an average slope of a surface of the polymer-based insulating material which faces away from the semiconductor substrate, as measured with respect to the first main surface of the metal structure, is less than 60 degrees along the periphery region of the metal structure.

Example 2. The semiconductor device of example 1, wherein the average slope of the polymer-based insulating material is less than 45 degrees.

Example 3. The semiconductor device of example 1, wherein the average slope of the polymer-based insulating material is less than 35 degrees.

Example 4. The semiconductor device of example 1, wherein the average slope of the polymer-based insulating material is less than 20 degrees.

Example 5. The semiconductor device of any of examples 1 through 4, wherein the semiconductor device is a power transistor, wherein the metal structure is at a source potential and laterally separated from an additional metal structure which is at a second potential that is different from the source potential, and wherein the polymer-based insulating material covers the additional metal structure.

Example 6. The semiconductor device of any of examples 1 through 5, wherein the polymer-based insulating material is a polyimide.

Example 7. The semiconductor device of any of examples 1 through 6, wherein the polymer-based insulating material has undulations over the transition section of the metal structure.

Example 8. A semiconductor device, comprising: a semiconductor substrate having a first main surface; a first electrically conductive structure above the first main surface of the semiconductor substrate, the first electrically conductive structure having a region; a polymer-based insulating material in contact with and covering at least the region of the first electrically conductive structure, wherein a thickness of the polymer-based insulating material begins to increase on a first main surface of the first electrically conductive structure that faces away from the semiconductor substrate, wherein an average slope of a surface of the polymer-based insulating material which faces away from the semiconductor substrate, as measured with respect to the first main surface of the first electrically conductive structure, is less than 60 degrees along the region of the first electrically conductive structure; and a second electrically conductive structure above the polymer-based insulating material.

Example 9. The semiconductor device of example 8, wherein the semiconductor device is a power transistor, wherein the first electrically conductive structure is at a source potential, and wherein the second electrically conductive structure contacts the first electrically conductive structure outside the region of the first electrically conductive structure that is in contact with and covered by the polymer-based insulating material.

Example 10. The semiconductor device of example 8 or 9, wherein the polymer-based insulating material is a polyimide.

Example 11. A method of producing a semiconductor device, the method comprising: forming a metal structure above a first main surface of a semiconductor substrate, the metal structure having a periphery region that includes a transition section along which the metal structure transitions from a first thickness to a second thickness less than the first thickness; forming a polymer-based insulating material on at least the periphery region of the metal structure; varying a degree of polymer cross-linking within the polymer-based insulating material along the periphery region of the metal structure, such that the degree of the polymer cross-linking increases with increasing thickness of the polymer-based insulating material; and after varying the degree of the polymer cross-linking, curing the polymer-based insulating material.

Example 12. The method of example 11, wherein varying the degree of the polymer cross-linking comprises: applying grayscale lithography to a region with increasing thickness of the polymer-based insulating material.

Example 13. The method of example 12, wherein applying the grayscale lithography to the region with increasing thickness of the polymer-based insulating material comprises: forming a photolithographic mask on the polymer-based insulating material, the photolithographic mask comprising a grayscale zone disposed over the region with increasing thickness of the polymer-based insulating material and having a plurality of shapes; and directing light towards the photolithographic mask, wherein the plurality of shapes in the grayscale zone of the photolithographic mask block some of the light from reaching the region with increasing thickness of the polymer-based insulating material.

Example 14. The method of example 13, wherein at least one of a size of the shapes in the grayscale zone of the photolithographic mask or a spacing between the shapes in the grayscale zone of the photolithographic mask varies with increasing thickness of the polymer-based insulating material.

Example 15. The method of example 14, wherein the size of the shapes is in a range of a sub-resolution of the polymer-based insulating material.

Example 16. The method of any of examples 13 through 15, wherein forming the photolithographic mask comprises: sputtering a chromium layer on a glass substrate; and etching the shapes into the chromium layer.

Example 17. The method of any of examples 13 through 15, wherein forming the photolithographic mask comprises: sputtering a plurality of chromium layers of different thicknesses on a glass substrate.

Example 18. The method of any of examples 11 through 17, wherein the semiconductor device is a power transistor, wherein the metal structure is at a source potential and laterally separated from an additional metal structure which is at a second potential that is different from the source potential, and wherein the polymer-based insulating material covers the additional metal structure.

Example 19. The method of example 18, further comprising: forming a metallization layer or layer stack over the metal structure and over the additional metal structure, wherein the metallization layer or layer stack contacts the metal structure, wherein the additional metal structure is insulated from the metallization layer or layer stack by the polymer-based insulating material.

Example 20. The method of any of examples 11 through 19, wherein forming the polymer-based insulating material comprises: forming one or more polyimide layers on the periphery region of the metal structure.

Example 21. A semiconductor device, comprising: a semiconductor substrate having a first main surface; a metal structure above the first main surface of the semiconductor substrate, the metal structure having a periphery region that includes a transition section along which the metal structure transitions from a first thickness to a second thickness less than the first thickness; and a polymer-based insulating material in contact with and covering at least the periphery region of the metal structure, wherein a thickness of the polymer-based insulating material begins to increase on a first main surface of the metal structure that faces away from the semiconductor substrate and continues to increase in a direction towards the transition section of the metal structure, wherein the polymer-based insulating material has undulations over the transition section of the metal structure.

Example 22. The semiconductor device of example 21, wherein the semiconductor device is a power transistor, wherein the metal structure is at a source potential and laterally separated from a gate finger or a sensor line which is at a different potential than the source potential, and wherein the polymer-based insulating material covers the gate finger or sensor line.

Example 23. The semiconductor device of example 21 or 22, wherein the polymer-based insulating material is a polyimide.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate having a first main surface;
   an electrically conductive structure above the first main surface of the semiconductor substrate, the electrically conductive structure having a periphery region that includes a transition section along which the electrically conductive structure transitions from a first thickness to a second thickness less than the first thickness; and
   a polymer-based insulating material in contact with and covering at least the periphery region of the metal structure,
   wherein a thickness of the polymer-based insulating material begins to increase on a first main surface of the electrically conductive structure that faces away from the semiconductor substrate and continues to increase in a direction towards the transition section of the electrically conductive structure,
   wherein an average slope of a surface of the polymer-based insulating material which faces away from the semiconductor substrate, as measured with respect to the first main surface of the electrically conductive structure, is less than 60 degrees along the periphery region of the electrically conductive structure.

2. The semiconductor device of claim 1, wherein the average slope of the polymer-based insulating material is less than 45 degrees.

3. The semiconductor device of claim 1, wherein the average slope of the polymer-based insulating material is less than 35 degrees.

4. The semiconductor device of claim 1, wherein the average slope of the polymer-based insulating material is less than 20 degrees.

5. The semiconductor device of claim 1, wherein the semiconductor device is a power transistor, wherein the electrically conductive structure is at a source potential and laterally separated from an additional electrically conductive structure which is at a second potential that is different from the source potential, and wherein the polymer-based insulating material covers the additional electrically conductive structure.

6. The semiconductor device of claim 1, wherein the polymer-based insulating material is a polyimide.

7. The semiconductor device of claim 1, wherein the polymer-based insulating material has undulations over the transition section of the electrically conductive structure.

8. A semiconductor device, comprising:
   a semiconductor substrate having a first main surface;
   a first electrically conductive structure above the first main surface of the semiconductor substrate, the first electrically conductive structure having a region;
   a polymer-based insulating material in contact with and covering at least the region of the first electrically conductive structure, wherein a thickness of the polymer-based insulating material begins to increase on a first main surface of the first electrically conductive structure that faces away from the semiconductor substrate, wherein an average slope of a surface of the polymer-based insulating material which faces away from the semiconductor substrate, as measured with respect to the first main surface of the first electrically conductive structure, is less than 60 degrees along the region of the first electrically conductive structure; and a second electrically conductive structure above the polymer-based insulating material.

9. The semiconductor device of claim 8, wherein the semiconductor device is a power transistor, wherein the first electrically conductive structure is at a source potential, and wherein the second electrically conductive structure contacts the first electrically conductive structure outside the region of the first electrically conductive structure that is in contact with and covered by the polymer-based insulating material.

10. The semiconductor device of claim 8, wherein the polymer-based insulating material is a polyimide.

11. A method of producing a semiconductor device, the method comprising:

forming a electrically conductive structure above a first main surface of a semiconductor substrate, the electrically conductive structure having a periphery region that includes a transition section along which the electrically conductive structure transitions from a first thickness to a second thickness less than the first thickness;

forming a polymer-based insulating material on at least the periphery region of the electrically conductive structure;

varying a degree of polymer cross-linking within the polymer-based insulating material along the periphery region of the electrically conductive structure, such that the degree of the polymer cross-linking increases with increasing thickness of the polymer-based insulating material; and after varying the degree of the polymer cross-linking, curing the polymer-based insulating material.

12. The method of claim 11, wherein varying the degree of the polymer cross-linking comprises:

applying grayscale lithography to a region with increasing thickness of the polymer-based insulating material.

13. The method of claim 12, wherein applying the grayscale lithography to the region with increasing thickness of the polymer-based insulating material comprises:

forming a photolithographic mask on the polymer-based insulating material, the photolithographic mask comprising a grayscale zone disposed over the region with increasing thickness of the polymer-based insulating material and having a plurality of shapes; and directing light towards the photolithographic mask, wherein the plurality of shapes in the grayscale zone of the photolithographic mask block some of the light from reaching the region with increasing thickness of the polymer-based insulating material.

14. The method of claim 13, wherein at least one of a size of the shapes in the grayscale zone of the photolithographic mask or a spacing between the shapes in the grayscale zone of the photolithographic mask varies with increasing thickness of the polymer-based insulating material.

15. The method of claim 14, wherein the size of the shapes is in a range of a sub-resolution of the polymer-based insulating material.

16. The method of claim 13, wherein forming the photolithographic mask comprises:

sputtering a chromium layer on a glass substrate; and etching the shapes into the chromium layer.

17. The method of claim 13, wherein forming the photolithographic mask comprises:

sputtering a plurality of chromium layers of different thicknesses on a glass substrate.

18. The method of claim 11, wherein the semiconductor device is a power transistor, wherein the electrically conductive structure is at a source potential and laterally separated from an additional electrically conductive structure which is at a second potential that is different from the source potential, and wherein the polymer-based insulating material covers the additional electrically conductive structure.

19. The method of claim 18, further comprising:

forming a metallization layer or layer stack over the electrically conductive structure and over the additional electrically conductive structure, wherein the metallization layer or layer stack contacts the electrically conductive structure, wherein the additional electrically conductive structure is insulated from the metallization layer or layer stack by the polymer-based insulating material.

20. The method of claim 11, wherein forming the polymer-based insulating material comprises:

forming one or more polyimide layers on the periphery region of the electrically conductive structure.

* * * * *

UNITED STATES PATENT AND TRADEMARK OFFICE
CERTIFICATE OF CORRECTION

| | |
|---|---|
| PATENT NO. | : 11,804,432 B2 |
| APPLICATION NO. | : 17/173863 |
| DATED | : October 31, 2023 |
| INVENTOR(S) | : M. Zundel et al. |

Page 1 of 1

It is certified that error appears in the above-identified patent and that said Letters Patent is hereby corrected as shown below:

In the Claims

Column 12, Lines 25-26 (Claim 1, Lines 11-12) please change "the metal structure" to -- the electrically conductive structure --

Column 13, Line 25 (Claim 11, Line 3) please change "forming a" to -- forming an --

Signed and Sealed this
Thirtieth Day of January, 2024

Katherine Kelly Vidal
*Director of the United States Patent and Trademark Office*